US007745316B2

United States Patent
Kim et al.

(10) Patent No.: US 7,745,316 B2
(45) Date of Patent: Jun. 29, 2010

(54) METHOD FOR FABRICATING SCHOTTKY BARRIER TUNNEL TRANSISTOR

(75) Inventors: Yark-Yeon Kim, Daejon (KR);
Seong-Jae Lee, Daejon (KR);
Moon-Gyu Jang, Daejon (KR);
Tae-Youb Kim, Seoul (KR); Chel-Jong Choi, Daejon (KR); Myung-Sim Jun, Daejon (KR); Byoung-Chul Park, Daejon (KR)

(73) Assignee: Electronics and Telecommunications Research Institute, Daejon (KR)

( * ) Notice: Subject to any disclaimer, the term of this patent is extended or adjusted under 35 U.S.C. 154(b) by 186 days.

(21) Appl. No.: 11/930,902

(22) Filed: Oct. 31, 2007

(65) Prior Publication Data

US 2008/0132049 A1 Jun. 5, 2008

(30) Foreign Application Priority Data

Dec. 1, 2006 (KR) .................. 10-2006-0120565

(51) Int. Cl.
H01L 21/28 (2006.01)
H01L 21/44 (2006.01)

(52) U.S. Cl. ................. 438/570; 438/582; 257/E21.45; 257/E21.616

(58) Field of Classification Search .......... 438/570, 438/571, 582; 257/E21.45, E21.616, E21.164, 257/E21.148
See application file for complete search history.

(56) References Cited

U.S. PATENT DOCUMENTS 6,339,005 B1   1/2002   Bryant et al.
6,693,294 B1   2/2004   Jang et al.
2006/0131664 A1*  6/2006  Kim et al. ............... 257/384
2007/0034951 A1*  2/2007  Kim et al. ............... 257/347

FOREIGN PATENT DOCUMENTS

| JP | 2002-237602 | 8/2002 |
| KR | 1998-0012603 A | 4/1998 |
| KR | 10-2000-0066155 | 11/2000 |
| KR | 10-2004-0008407 | 1/2004 |
| KR | 2005-0033179 A | 4/2005 |
| KR | 2005-0075448 A | 7/2005 |

OTHER PUBLICATIONS

"Suppression of Leakage Current in Schottky Barrier Metal-Oxide-Semiconductor Field-Effect Transistors" L.E. Calvet et al., Journal of Applied Physics, vol. 91, No. 2, pp. 757-759, Jan. 15, 2002.

* cited by examiner

Primary Examiner—Walter L Lindsay, Jr.
(74) Attorney, Agent, or Firm—Rabin & Berdo, P.C.

(57) ABSTRACT

Provided is a method for fabricating a Schottky barrier tunnel transistor (SBTT) that can fundamentally prevent the generation of a gate leakage current caused by damage of spacers formed on both sidewalls of a gate electrode. The method for fabricating a Schottky barrier tunnel transistor, which includes: a) forming a silicon pattern and a sacrificial pattern on a buried oxide layer supported by a support substrate; b) forming a source/drain region on the buried oxide layer exposed on both sides of the silicon pattern, the source/drain region being formed of a metal layer and being in contact with both sidewalls of the silicon pattern; c) removing the sacrificial pattern to expose the top surface of the silicon pattern; and d) forming a gate insulating layer and a gate electrode on the exposed silicon pattern.

15 Claims, 10 Drawing Sheets

METHOD FOR FABRICATING SCHOTTKY BARRIER TUNNEL TRANSISTOR

CROSS-REFERENCE(S) TO RELATED APPLICATIONS

The present invention claims priority of Korean Patent Application No. 10-2006-0120565, filed on Dec. 1, 2007, which is incorporated herein by reference.

BACKGROUND OF THE INVENTION

1. Field of the Invention

The present invention relates to a semiconductor fabrication technology; and, more particularly, to a method for fabricating a Schottky barrier tunnel transistor (SBTT) using a Schottky barrier between a metal and a semiconductor.

2. Description of Related Art

The recent advance of semiconductor fabrication technologies makes it possible to fabricate semiconductor devices having a short channel of 50 nm or less. However, as the size of the devices becomes smaller, new phenomenon occurs which deteriorates operation characteristics of the devices. Specifically, a transistor having a channel length of 100 nm or less must be carefully controlled because a leakage current caused by a short channel effect significantly increases.

To solve this problem, studies have been conducted on SBTT devices in which a source region and a drain region are formed of metal or silicide.

FIG. 1 is a cross-sectional view of a conventional SBTT.

Referring to FIG. 1, the conventional SBTT includes a support substrate 10, a buried oxide layer (BOX) 11 formed on the support substrate 10, a source/drain region 12 formed within a silicon layer on the buried oxide layer 11, a gate insulating layer 13 formed on a channel region 16 of the silicon layer, a gate electrode 14 formed on the gate insulating layer 13, and spacers 15 formed on both sidewalls of the gate electrode 14.

The conventional SBTT has a vertical structure in which the gate insulating layer 13 and the gate electrode 14 are sequentially stacked on the silicon layer. This vertical structure is similar to a typical metal oxide semiconductor field effect transistor (MOSFET) structure. However, unlike the MOSFET, the source/drain region 12 is formed by a sputtering process, not an ion implantation process. More specifically, after a metal layer is deposited by a sputtering process, a thermal treatment is performed to react the metal layer with silicon, thereby forming a metal silicide layer. At this point, a metal silicide layer 17 is also formed on the gate electrode 14.

However, since the gate electrode is first formed and the source/drain region is then formed by the silicide process using a rare earth metal having a very strong reactivity, the spacers on both sidewalls of the gate electrode are damaged during the silicide process. Further, a leakage current may be generated from the damaged region.

SUMMARY OF THE INVENTION

An embodiment of the present invention is directed to providing a method for fabricating an SBTT that can fundamentally prevent the generation of a gate leakage current caused by damage of spacers formed on both sidewalls of a gate electrode.

In accordance with an aspect of the present invention, there is provided a method for fabricating a Schottky barrier tunnel transistor, which includes: a) forming a silicon pattern and a sacrificial pattern on a buried oxide layer supported by a support substrate; b) forming a source/drain region on the buried oxide layer exposed on both sides of the silicon pattern, the source/drain region being formed of a metal layer and being in contact with both sidewalls of the silicon pattern; c) removing the sacrificial pattern to expose the top surface of the silicon pattern; and d) forming a gate insulating layer and a gate electrode on the exposed silicon pattern.

According to the conventional method for fabricating an SBTT, spacers are formed on both sidewalls of a gate electrode and a silicide process is performed to form a source/drain region. Thus, the spacers directly exposed by the silicide process are damaged. However, in accordance with the embodiments of the present invention, a source/drain region is formed by a silicide process before spacers are formed. Then, a gate electrode and spacers are formed, thereby fundamentally preventing damage of the spacers. Therefore, the generation of the gate leakage current due to the damage of the spacers can be prevented.

Other objects and advantages of the present invention can be understood by the following description, and become apparent with reference to the embodiments of the present invention. Also, it is obvious to those skilled in the art to which the present invention pertains that the objects and advantages of the present invention can be realized by the means as claimed and combinations thereof.

DESCRIPTION OF SPECIFIC EMBODIMENTS

Figure 1:
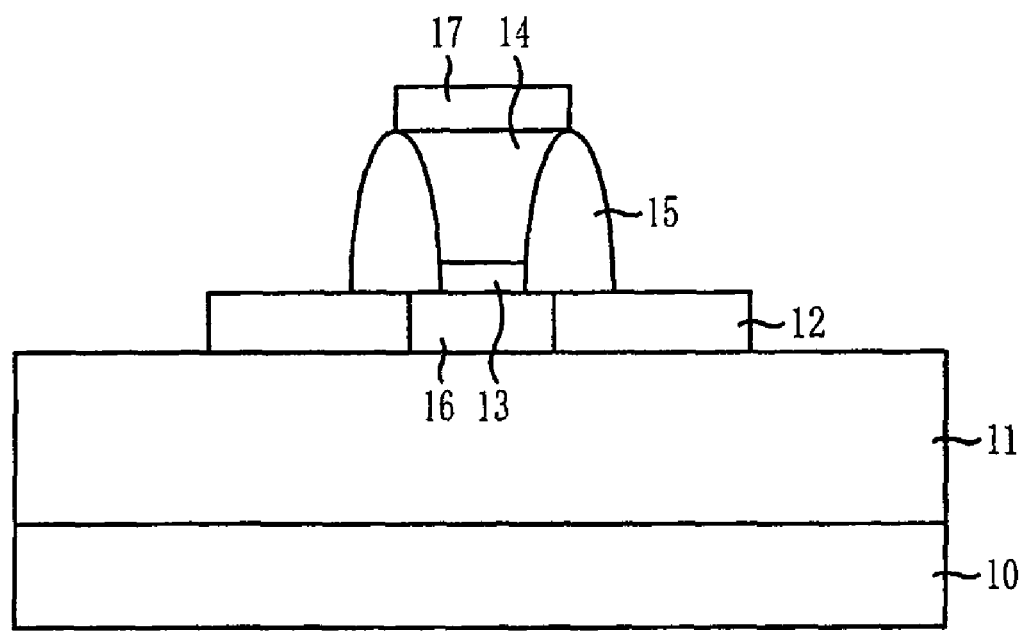
FIG. 1 is a cross-sectional view of a conventional Schottky barrier tunnel transistor.

The advantages, features and aspects of the invention will become apparent from the following description of the embodiments with reference to the accompanying drawings, which is set forth hereinafter. In the figures, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under the other layer, and one or more intervening layers may also be present. In addition, it will also be understood that when a layer is referred to as being 'between' two layers, it can be the only layer between the two layers, or one or more intervening layers may also be present. Like reference numerals refer to like elements throughout.

Figure 2A:
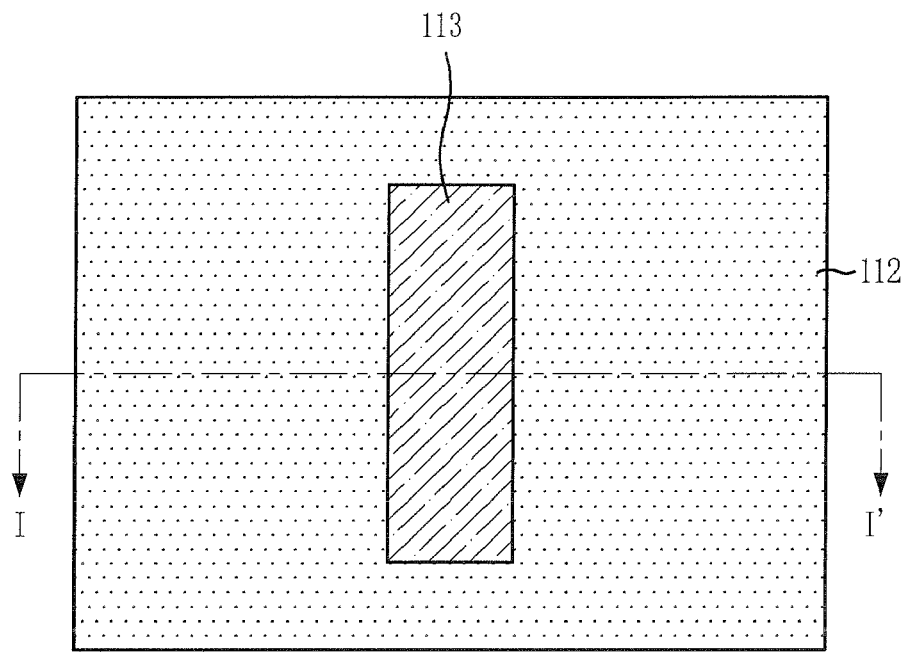
FIGS. 2A to 10B are sectional views illustrating a method for manufacturing an SBTT in accordance with an embodiment of the present invention.

FIGS. 2A to 10B are sectional views illustrating a method for fabricating an SBTT in accordance with an embodiment of the present invention. Specifically. FIGS. 2A, 3A, . . . , and 10A are plan views of the SBTT, and FIGS. 2B, 3B, . . . , and 10B are cross-sectional views taken along line I-I' of FIGS. 2A, 3A, . . . , and 10A, respectively.

Figure 2B:
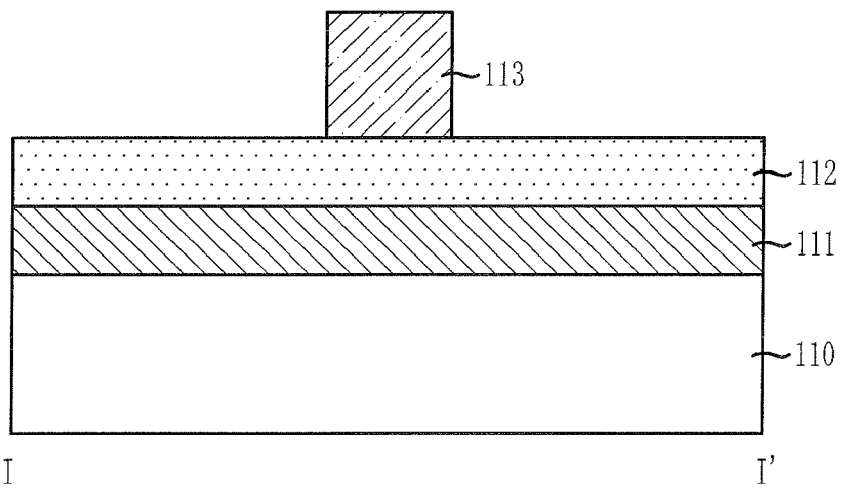
Figure 3A:
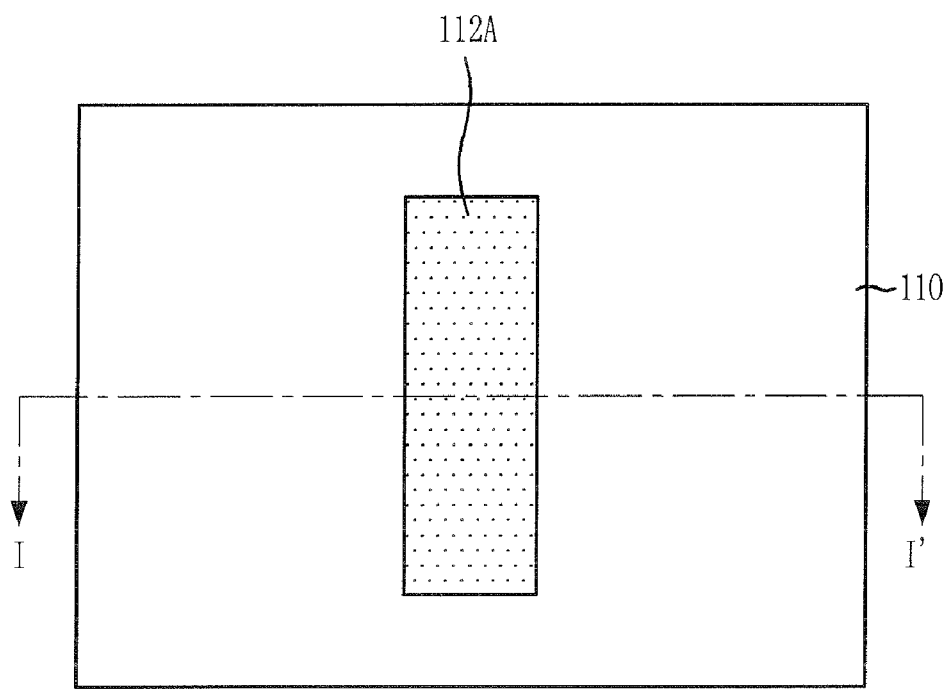
Figure 3B:
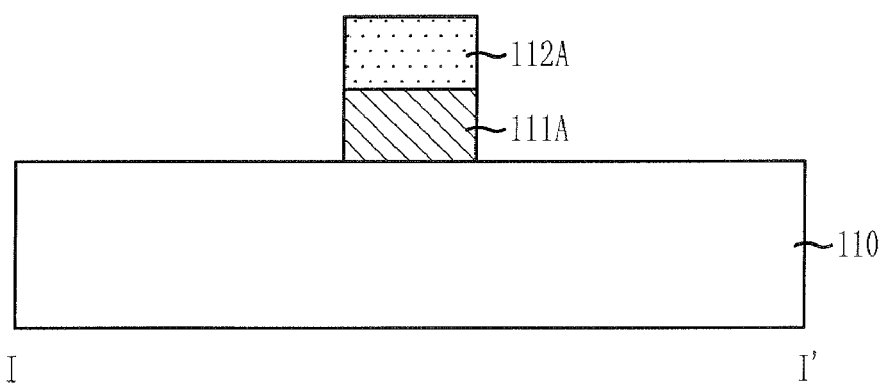

Referring to FIGS. 2A and 2B, a silicon-on-insulator (SOI) substrate is prepared. The SOI substrate includes a buried oxide layer (BOX) 110 and a silicon layer 111, which are sequentially stacked on a support substrate (not shown). The silicon layer 11 is formed to a thickness of less than 100 nm. However, it is preferable that the silicon layer 111 is formed so thick that a channel can be controlled by an electric field controlled by a gate. Therefore, the formation of an inversion layer can be easily controlled because the thickness of the channel region controlled by the gate is reduced. Consequently, a leakage current between the source and the drain of the transistor is reduced.

A cheap bulk substrate may also be used instead of the SOI substrate.

Then, an ion implantation process for forming a well and an ion implantation process for controlling a threshold voltage are carried out. For example, in forming a well of a p-type device, the silicon layer 111 is formed by doping p-type impurity ions such as boron. In forming a well of an n-type device, the silicon layer 111 is formed by doping n-type impurity ions such phosphorus or arsenic of Group V. At this point, an impurity concentration of the silicon layer 111 is low, for example, $10^{-7}$ atoms/cm$^3$.

An oxide layer (not shown) may be formed as a passivation layer on the silicon layer 111. The oxide layer (not shown) serves to protect the silicon layer 111 in a subsequent process of removing a sacrificial metal layer 112, and also makes it easy to remove the sacrificial metal layer 112.

Then, a sacrificial metal layer 112 is deposited on the silicon layer 111. The sacrificial metal layer 112 is formed of transition metal. For example, the sacrificial metal layer 112 may be formed of tungsten (W) that is easily removed by hydrogen peroxide ($H_2O_2$). Further, examples of the transition metal include iron (Fe), cobalt (Co), nickel (Ni), palladium (Pd), platinum (Pt), molybdenum (Mo), and titanium (Ti).

A photoresist layer is coated on the sacrificial metal layer 112 and an exposure process and a development process are performed on the photoresist layer using a photo mask, thereby forming a bar-shaped photoresist pattern 113. The exposure process and the development process will be referred to as a photo process.

Referring to FIG. 3, the sacrificial metal layer 112 and the silicon layer 111 are etched by an etching process using the photoresist pattern 113 as an etch mask. The etching process may be a wet etching process or a dry etching process. In this embodiment, the dry etching process is carried out. As a result, a sacrificial metal pattern 112A and a silicon pattern 111A are formed. The silicon pattern 111A becomes a channel region.

The photoresist pattern 113 is removed by a stripping process.

Figure 4A:
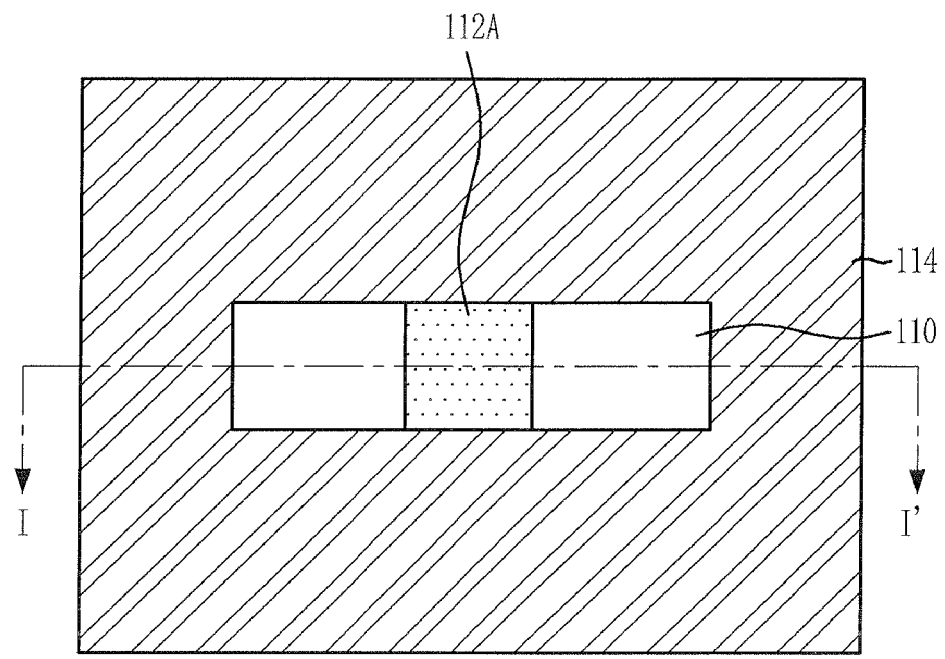
Figure 4B:
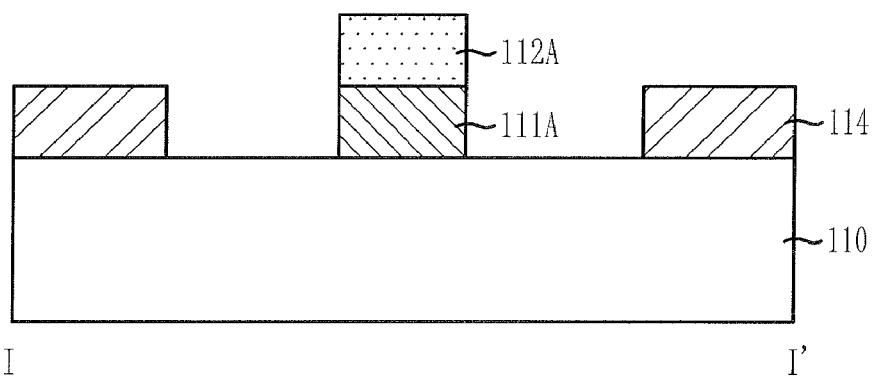

Referring to FIGS. 4A and 4B, a photo process is performed to a photoresist pattern 114 having an opening exposing a region where a source/drain region will be formed. The opening of the photoresist pattern 114 is formed to cross a bar-shaped sacrificial metal layer pattern 122A.

Figure 5A:
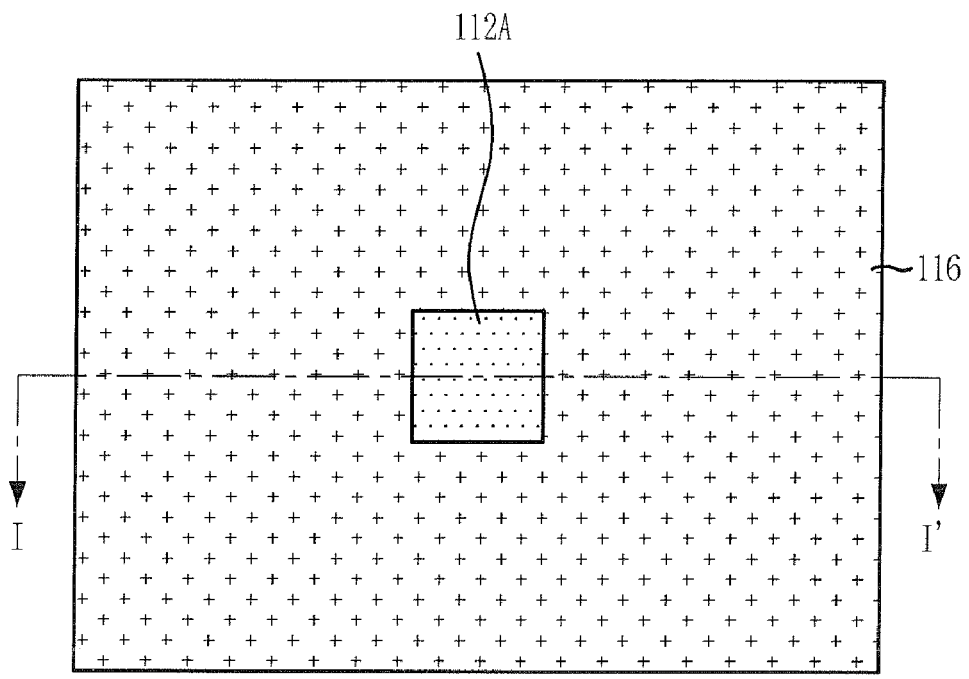
Figure 5B:
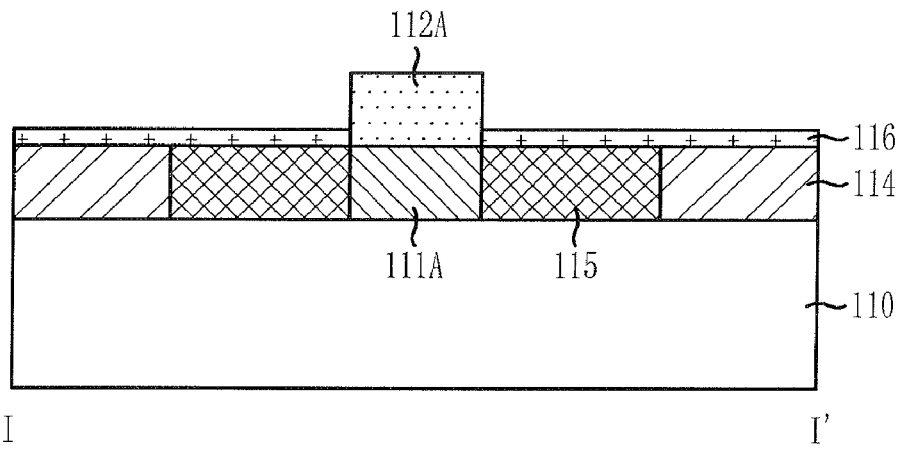

Referring to FIGS. 5A and 5B, a metal layer is formed on the buried oxide layer 110 exposed through the opening of the photoresist pattern 114, thereby forming a source/drain region 115. The source/drain region 115 is thicker than the silicon pattern 111A serving as the channel region. Further, the metal layer may be formed of transition metal and rare earth metal. However, it is preferable that an n-type transistor is formed of rare earth metal having a low work function and a p-type transistor is formed of transition metal having a high work function. Examples of the rare earth metal include erbium (Er), ytterbium (Yb), samarium (Sm), yttrium (Y), lanthanum (La), cerium (Ce), terbium (Tb), dysprosium (Dy), holmium (Ho), thulium (Tm), and lutetium (Lu).

Meanwhile, a glue layer (not shown) may be formed on the buried oxide layer 110 so as to increase the adhesion between the buried oxide layer 110 and the metal layer before forming the source/drain region 115. The glue layer (not shown) may be formed of chromium (Cr) or tantalum (Ta).

A thermal treatment may be performed to react the metal of the source/drain region 115 with the silicon of the silicon pattern 111A, thereby forming a metal silicide layer (not shown) along the boundary between the source/drain region 115 and the silicon pattern 111A. Examples of the thermal treatment include a rapid thermal annealing (RTA), a furnace annealing, and a laser annealing.

A passivation metal layer 116 is formed over the resulting structure, including the buried oxide layer 110 and the source/drain region 115. The passivation metal layer 116 is formed using a metal layer having a high etch selectivity with respect to the sacrificial metal layer pattern 112A. More specifically, when the sacrificial metal layer pattern 112A is formed of tungsten (W), the passivation metal layer 116 is formed of tantalum (Ta). Since tungsten (W) has a higher etch rate with respect to hydrogen peroxide, while tantalum (Ta) has a low etch rate with respect to hydrogen peroxide. Due to this characteristic, the sacrificial metal layer pattern 112A can be selectively removed without loss of the passivation metal layer 116. Further, the passivation metal layer 116 is formed to a thickness of 20 nm (±5 nm).

Figure 6A:
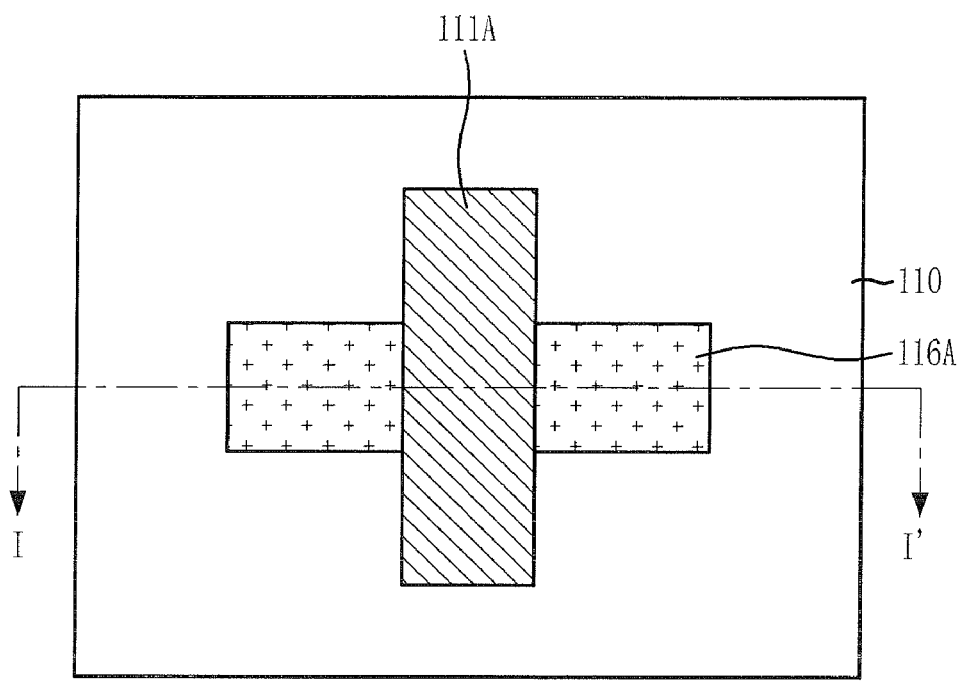
Figure 6B:
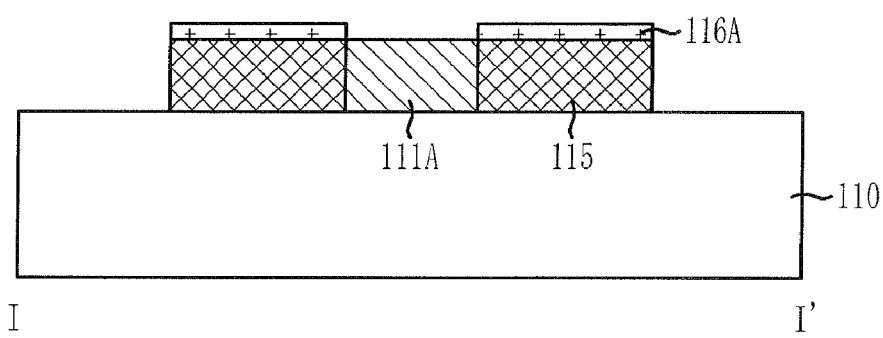

Referring to FIGS. 6A and 6B, the sacrificial metal layer pattern 112A is selectively removed. The removing process is performed by heating hydrogen peroxide to a temperature of more than 50° C., preferably to a temperature ranging from approximately 50° C. to approximately 200° C. The reason for this is that tungsten (W) is more easily removed by hydrogen peroxide than tantalum (Ta).

Then, the photoresist pattern 114 is removed. At this point, the passivation metal layer 116 formed on the photoresist pattern 114 is also removed. Therefore, the passivation metal layer 116A remains only on the source/drain region 115. Although the metal layer for the source/drain region may also remain on the photoresist pattern 114, it is also removed in the process of removing the photoresist pattern 114.

Figure 7A:
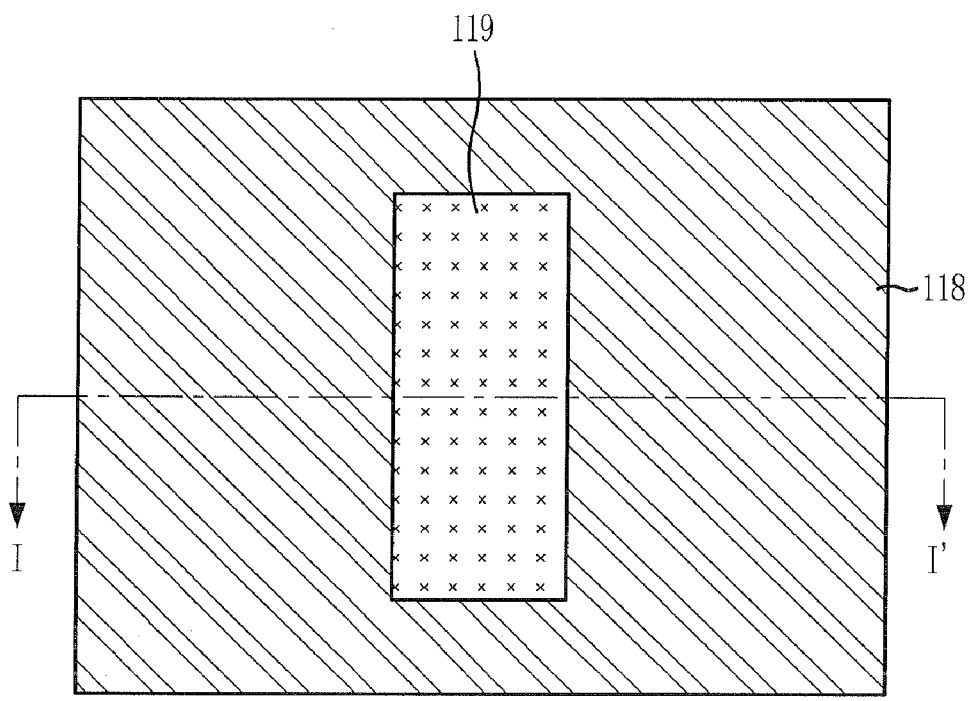
Figure 7B:
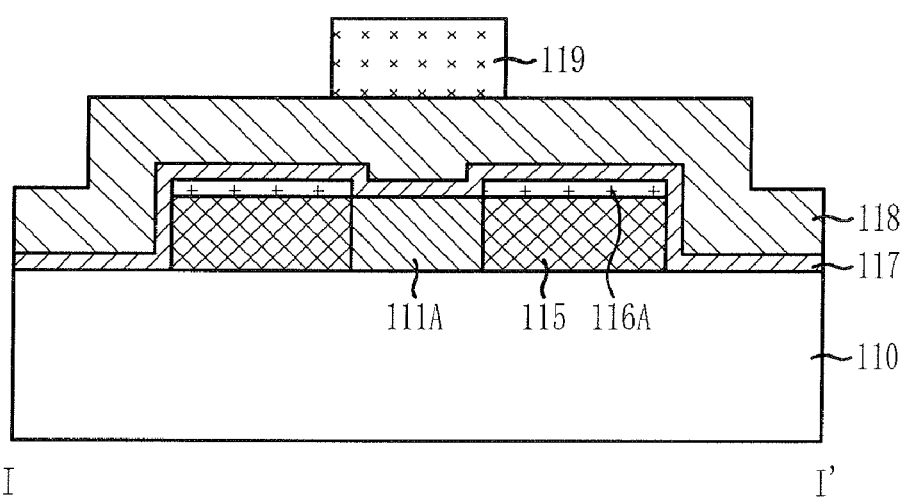

Referring to FIGS. 7A and 7B, a gate insulating layer 117 is formed along a stepped portion of the resulting structure, including the passivation metal layer pattern 116A. The gate insulating layer 117 may be formed of an oxide layer or an oxide layer within which a nitride layer is interposed. In addition, the gate insulating layer 117 may be formed of metal oxide having a higher permittivity than a silicon oxide ($SiO_2$) layer. Examples of the metal oxide include hafnium oxide ($HfO_2$), aluminum oxide ($Al_2O_3$), and zirconium oxide ($ZrO_2$). Meanwhile, an oxidation process is used to form a gate insulating layer 117 of an oxide material. Examples of the oxidation process include a wet oxidation process, a dry oxidation process, and a radical oxidation process.

A conductive layer 118 for a gate electrode is formed to cover the gate insulating layer 117. The conductive layer 118 is formed of transition metal or polysilicon. Preferably, the conductive layer 118 is formed in a single-layer structure of tungsten (W) or tantalum (Ta) or in a multi-layer structure of tungsten (W) and tantalum (Ta). A photo process is performed to form a photoresist pattern 119 on the conductive layer 118.

Figure 8A:
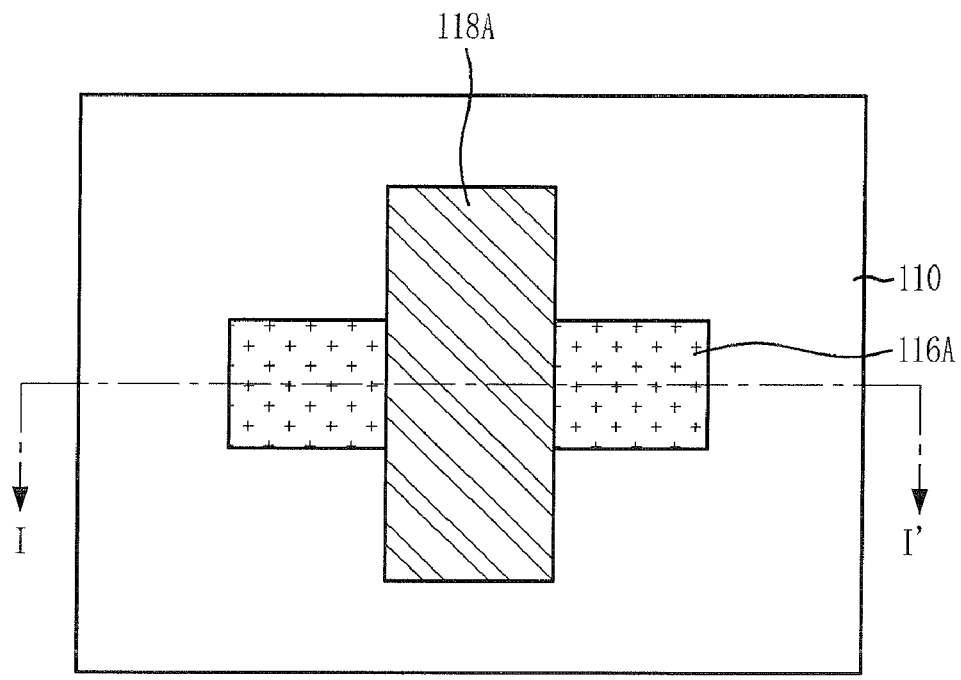
Figure 8B:
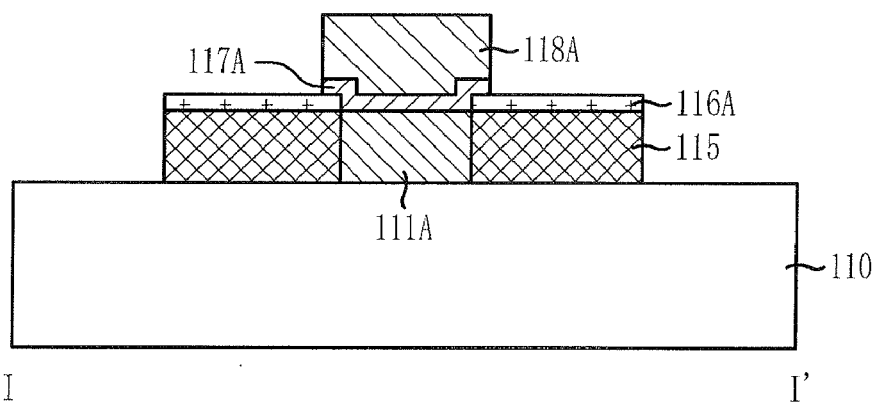

Referring to FIGS. 8A and 8B, the conductive layer 118 and the gate insulating layer 117 are etched by an etching process using the photoresist pattern 119 as an etch mask, thereby forming a gate electrode 118A. The etching process may be a wet etching process or a dry etching process. A reference numeral 117A refers to a gate insulating layer pattern, which will be referred to as a gate insulating layer. Then, the photoresist pattern 119 is removed.

Although the gate electrode 118A is formed using a negative photoresist layer in the above embodiment, it can also be formed by a lift-off process using a positive photoresist layer. That is, after forming the photoresist pattern, a material for the gate electrode is deposited on the photoresist pattern. Then, the lift-off process is performed to remove the photoresist pattern, so that the material for the gate electrode deposited on the photoresist pattern is removed. In this way, the gate electrode 118A is formed.

Figure 9A:
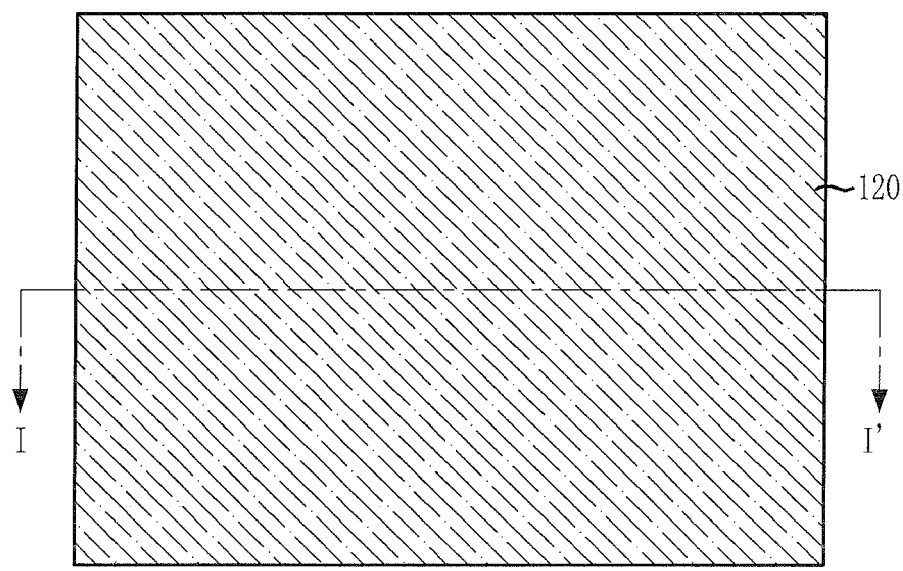
Figure 9B:
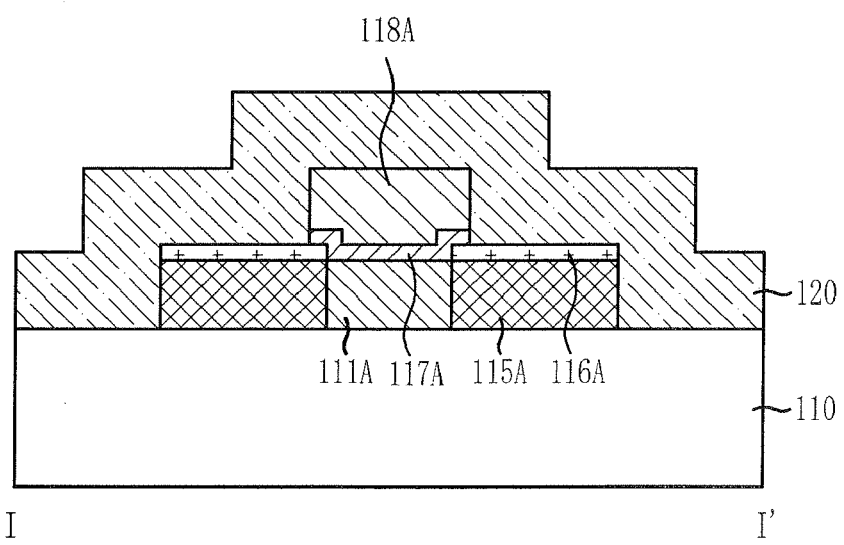

Referring to FIGS. 9A and 9B, an insulating layer 120 for spacers is formed along a stepped portion of the resulting structure, including the buried oxide layer 110 and the gate electrode 118A. The insulating layer 120 is formed of a low temperature oxide layer, an insulating layer, or a stacked structure thereof.

Figure 10A:
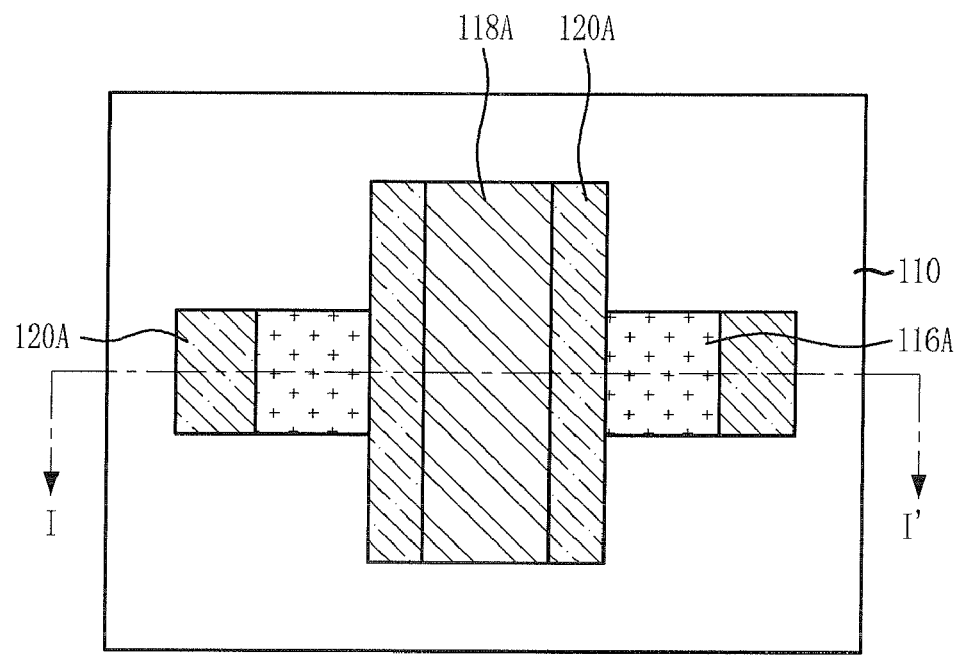
Figure 10B:
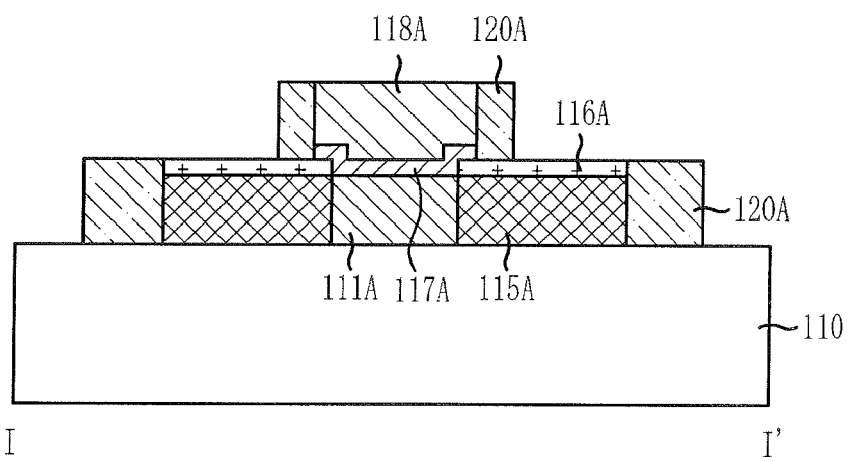

Referring to FIGS. 10A and 10B, a dry etching process such as a blanket or etch-back process is performed to etch the insulating layer 120, thereby forming spacers 120A on both sidewalls of the gate electrode 118A and on both sidewalls of the source/drain region 115A.

In the above-described embodiment, the thermal treatment is performed to form the metal silicide layer along the boundary between the source/drain region 115 and the silicon pattern 111A. However, the thermal treatment has only to be performed at least one time in the fabricating process of FIGS. 5A to 10B.

As described above, the damage of the spacers can be fundamentally prevented by forming the gate electrode and the spacers after forming the source/drain region using the silicide process. Therefore, the generation of the gate leakage current caused by the damage of the spacers can be fundamentally prevented.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a Schottky barrier tunnel transistor, comprising:
    a) forming a silicon pattern and a sacrificial pattern on a buried oxide layer supported by a support substrate;
    b) forming a source/drain region on the buried oxide layer exposed on both sides of the silicon pattern, the source/drain region being formed of a metal layer and being in contact with both sidewalls of the silicon pattern;
    c) removing the sacrificial pattern to expose the top surface of the silicon pattern;
    d) forming a gate insulating layer and a gate electrode on the exposed silicon pattern; and
    e) forming spacers on both sidewalls of the gate electrode after forming the gate electrode.

2. The method of claim 1, wherein the step b) includes the steps of:
    b1) forming a photoresist pattern having an opening at a region corresponding to a region where the source/drain region is to be formed; and
    b2) forming the metal layer to fill the opening of the photoresist pattern.

3. The method of claim 1, wherein the metal layer is formed from among the group of transition metals and rare earth metals.

4. The method of claim 1, further comprising the step of f) forming a passivation layer on the source/drain region after forming the source/drain region.

5. The method of claim 4, wherein the passivation layer is formed of tantalum (Ta).

6. The method of claim 1, wherein the sacrificial pattern is formed of tungsten (W).

7. The method of claim 6, wherein the sacrificial pattern is removed using hydrogen peroxide.

8. The method of claim 7, wherein the hydrogen peroxide is heated to a temperature ranging from approximately 50° C. to approximately 200° C.

9. The method of claim 1, further comprising the step of g) forming a glue layer on the buried oxide layer before forming the source/drain region.

10. The method of claim 9, wherein the glue layer is formed of chromium (Cr) or tantalum (Ta).

11. The method of claim 1, further comprising, after forming the source/drain region, the step of h) performing a thermal treatment to react the metal layer of the source/drain region with silicon of the silicon pattern, thereby forming a metal silicide layer along a boundary between the source/drain region and the silicon pattern.

12. The method of claim 1, further comprising, after removing the sacrificial pattern to expose the top surface of the silicon pattern, the step of i) performing a thermal treatment to react the metal layer of the source/drain region with silicon of the silicon pattern, thereby forming a metal silicide layer along a boundary between the source/drain region and the silicon pattern.

13. The method of claim 1, further comprising, after forming the gate electrode, the step of j) performing a thermal treatment to react the metal layer of the source/drain region with silicon of the silicon pattern, thereby forming a metal silicide layer along a boundary between the source/drain region and the silicon pattern.

14. A method for fabricating a Schottky barrier tunnel transistor, comprising:
    a) forming a silicon pattern and a sacrificial pattern on a buried oxide layer supported by a support substrate;
    b) forming a source/drain region on the buried oxide layer exposed on both sides of the silicon pattern, including the steps of
    b1) forming a photoresist pattern having an opening at a region corresponding to a region where the source/drain region is to be formed, and
    b2) forming the metal layer to fill the opening of the photoresist pattern,
    the source/drain region being formed of a metal layer and being in contact with both sidewalls of the silicon pattern;
    c) removing the sacrificial pattern to expose the top surface of the silicon pattern; and
    d) forming a gate insulating layer and a gate electrode on the exposed silicon pattern.

15. A method for fabricating a Schottky barrier tunnel transistor, comprising:
    a) forming a silicon pattern and a sacrificial pattern on a buried oxide layer supported by a support substrate;
    b) forming a source/drain region on the buried oxide layer exposed on both sides of the silicon pattern, the source/drain region being formed of a metal layer and being in contact with both sidewalls of the silicon pattern;
    c) removing the sacrificial pattern to expose the top surface of the silicon pattern;
    d) forming a gate insulating layer and a gate electrode on the exposed silicon pattern; and
    j) performing a thermal treatment to react the metal layer of the source/drain region with silicon of the silicon pattern after forming the gate electrode, thereby forming a metal silicide layer along a boundary between the source/drain region and the silicon pattern.

* * * * *